(12) United States Patent
Salmela

(10) Patent No.: US 6,714,104 B1
(45) Date of Patent: Mar. 30, 2004

(54) INVERTED MICROTRIP TRANSMISSION LINE INTEGRATED IN A MULTILAYER STRUCTURE

(75) Inventor: Olli Salmela, Helsinki (FI)

(73) Assignee: Nokia Networks Oy (FI)

( * ) Notice: Subject to any disclaimer, the term of this patent is extended or adjusted under 35 U.S.C. 154(b) by 0 days.

(21) Appl. No.: 09/937,506
(22) PCT Filed: Mar. 30, 2000
(86) PCT No.: PCT/FI00/00274
§ 371 (c)(1), (2), (4) Date: Sep. 24, 2001
(87) PCT Pub. No.: WO00/62368
PCT Pub. Date: Oct. 19, 2000

(30) Foreign Application Priority Data

Mar. 31, 1999 (FI) ................................................ 990717

(51) Int. Cl.⁷ ................................................ H01P 3/08
(52) U.S. Cl. .................. 333/238; 333/246; 174/117 AS
(58) Field of Search ................................. 333/238, 246; 174/117 AS

(56) References Cited

U.S. PATENT DOCUMENTS

| 3,904,997 A | 9/1975 | Stinehelfer, Sr. ............. 333/238 |
| 5,105,055 A | 4/1992 | Mooney et al. ................ 174/27 |
| 5,990,768 A | * 11/1999 | Takahashi et al. ...... 333/238 X |

FOREIGN PATENT DOCUMENTS

| EP | 0845831 A2 | 6/1998 |
| JP | 4368005 | 12/1992 |
| JP | 09246814 A | 9/1997 |
| WO | WO 93/02485 | 2/1993 |

* cited by examiner

*Primary Examiner*—Benny Lee
(74) *Attorney, Agent, or Firm*—Perman & Green, LLP

(57) ABSTRACT

The invention relates to a transmission cable realized by multilayer technique, where the signal cable (20) is set at a desired distance from the wall of the cavity constructed for said transmission cable by means of a separate support element (25). The ground cable (21) included in the structure is placed on the cable cavity wall opposite to the signal cable. By using the transmission cable according to the invention, there is achieved a low attenuation per unit of length at RF frequencies.

16 Claims, 3 Drawing Sheets

INVERTED MICROTRIP TRANSMISSION LINE INTEGRATED IN A MULTILAYER STRUCTURE

This application claims the benefit of the earlier filed International Application No. PCT/FI00/00274, International Filing Date, Mar. 30, 2000, which designated the United States of America, and which International application was published under PCT Article 21(2) in English as WO Publication No. WO04/62368.

BACKGROUND OF THE INVENTION

1. Field of the Invention

The invention relates to a transmission cable constructed by multilayer technique, said cable being located in a cavity with a first surface and a second surface essentially parallel to the first, said transmission cable consisting of a signal cable that is essentially parallel with the first surface of the cavity, and of a ground cable that is placed on said second surface essentially in parallel with the signal cable.

2. Brief Description of Related Developments

Various different cable structures are utilised in the construction of electronic appliances. As the frequencies of operation increase, there are higher requirements set for the cable structures to be used, in order to prevent attenuation caused by said cable structures. At present, in the structures of electronic appliances, there is generally applied the so-called multilayer technique, which is based either on the HTCC technique (High Temperature Cofired Ceramics) or on the LTCC technique (Low Temperature Cofired Ceramics). With both manufacturing methods, the produced structures consist of several green tapes, with a thickness of about 100 $\mu$m, which are positioned one on top of the other. Prior to thermal treatment, the material still is soft, so that in the green tapes, there can be made cavities of desired shapes. Likewise, at desired spots, there can be silk-screened various electrically passive elements. The elastic layers are laminated together by means of pressure. In order to prevent the lamination pressure from collapsing the structure that contains various cavities, the pressurising must be carried out according to a so-called unaxial method. This means that the pressure is directed to the object only in the direction of the axis z of said object. Finally the resultant structure is burnt, in the case of LTCC at 850 degrees and in the case of HTCC at 1,600 degrees. In the elements to be produced, at the cavities there are made perforations through which the excess pressure created in the burning process can be let out.

In FIGS. 1a and 1b, there is illustrated a possible alternative for realising an inverted microstrip cable based on the HTCC or LTCC multilayer technique according to the description above. In a preferred embodiment, the structure according to FIG. 1a is achieved by joining together, during the production process but prior to the burning step of the structure, the exemplary elements 12 and 13 illustrated in the drawing. Both of said elements are made layer by layer of some suitable dielectric material in a fashion described above. In the element 13, there is machined a rectangular groove, on the bottom of which there is silk-screened a signal cable 10. The thickness 18 of the element 13, as shown in FIG. 1b, when measured at the bottom of the groove, is sufficient to prevent disturbing ground potential levels from coming close to the described inverted microstrip cable. In the example illustrated FIG. 1b, the angle between the side walls of the groove made in the element 13 and the groove bottom 16, 17 is 90 degrees, but in principle the angles can have some other size, too. On the surface of the element 12, there is silk-screened a ground cable 11, the width whereof corresponds to the width of the groove made in the element 13. The elements 12 and 13 are machined separately, and when they are connected, there is obtained a structure according to FIG. 1a, where there is created a gas-filled cable cavity 14.

In FIG. 1b, there is illustrated a cross-section made in the direction A–A' of FIG. 1a. The attenuation and impedance of a transmission cable according to the invention are determined by the permitivity ($\in_r$) of the employed elements 12 and 13, as well as the geometric shape of the groove. From the drawing it is seen that the electromagnetic field emitted from the signal cable 10, said field in the drawing being illustrated by the power lines 15, proceeds a long way inside the element 13. With RF frequencies, the permitivity of the element 13 is clearly higher than the permitivity of the gas mixture filling the cable cavity 14. This results in that the cable attenuation is strongly increased with RF frequencies. The final multilayer structure of the apparatus also includes other material layers than those illustrated in FIGS. 1a and 1b, in which layers there may be provided passive components, cavities for active components and other cable structures, too.

However, the use of electric circuits manufactured by the above described techniques becomes problematic, if very high frequencies must be used (RF applications). Signal attenuation in a cable structure realised with LTCC technique at the frequency of 20 GHz rises up to 0.2 dB/cm, and in a cable structure realised with HTCC technique up to 0.6 dB/cm. In such RF applications where low attenuation is required, for example in filters and oscillation sources having a high quality factor (Q value), the above described techniques are no longer feasible.

Another problem with regular microstrip cables or inverted microstrip cables is the impedance level of the transmission cables realised by means of structures. An uncontrolled fluctuation of the impedance level results in undesired reflections of the signal back in the direction where the signal came from, or in radiation in the cable surroundings. Impedance is affected by the geometric shape of the cable structure, as well as by the relative permittivity ($\in_r$) of the surrounding material layers. In prior art structures, the above described two factors are the only free choices for adjusting the impedance.

With prior art LTCC and HTCC structures, another drawback is presented in the dispersion of the phase velocity with high frequencies. In a dispersed signal, the signal components contained therein at different frequencies have passed through the transmission cable at different velocities. This phenomenon distorts the received signal, and an excessive increase of the dispersion results in that the received signal becomes inapplicable.

From the U.S. Pat. No. 3,904,997 there is known an arrangement where the signal cable of an inverted microstrip resting on a substrate is encased in a shell-like structure made of metal. By means of this arrangement, both the attenuation of the transmission cable and the stray radiation scattered from the cable are attempted to be reduced. The metallic cable cavity must always be manufactured in advance, and its fastening in a reliable way to the rest of the multilayer structure causes problems. The fact that the thermal expansion coefficient of the metallic cable cavity is different from the basic substrate may cause the structure to break at the junction surface. Moreover, the structure includes a lot of manually performed work steps, wherefore it also is expensive in manufacturing costs.

From the U.S. Pat. No. 5,105,055 there is known an arrangement where in one flexible, cable-like structure there are integrated several cables. In said structure, the signal cable is attached to a dielectric substrate, and the ground cable is placed in a cavity-like structure made of another dielectric material. In principle, said cable is an entity made of several inverted microstrip cables. The materials of the cable structure are chosen among such materials that are elastic, and they can be processed with extrusion devices designed for processing plastics. Several variations of the cable structure are presented in the publication. According to said publication, the cable is meant to be used in connection with personal PC devices. Also in this case it is pointed out that owing to the target of usage, the materials chosen in the structure do not enable the use of RF frequencies.

The object of the invention is to reduce the described drawbacks connected to the prior art.

The transmission cable placed in a cavity according to the invention is characterised in that it comprises a support element with a surface essentially parallel to the first and second surfaces of the cavity, said support element being placed between said first and second surfaces, so that the signal cable is realised by means of an electroconductive material layer formed on the surface of said support element.

A number of preferred embodiments of the invention are set forth in the independent claims.

The basic principle of the invention is as follows: by applying multilayer technique, there is manufactured a modified, inverted microstrip cable, where the signal cable is attached, by means of a specially designed support element, on one surface of the cable cavity. Thus the effect of the material layers that encase the cable to the electromagnetic field surrounding said cable is remarkably reduced.

An advantage of the invention is that at RF frequencies the attenuation of a transmission cable according to the invention is clearly lower than with existing inverted microstrip cables, because the electromagnetic field emitted from the signal cable is mainly located in the gas-filled cable cavity, the permittivity ($\in_r$) of said cable cavity with respect to the permittivity of the surrounding dielectric materials being low.

Another advantage of the invention is that the transmission cable can be fully integrated in a multilayer structure without any specific work steps carried out expressly for this purpose.

Yet another advantage of the invention is that thereby the impedance level of the transmission cable can be adjusted as desired in a simple fashion.

BRIEF DESCRIPTION OF THE DRAWINGS

The invention is explained in more detail below. The description refers to the accompanying drawings, wherein.

DETAILED DESCRIPTION OF THE PREFERRED EMBODIMENT(S)

Figure 1A:
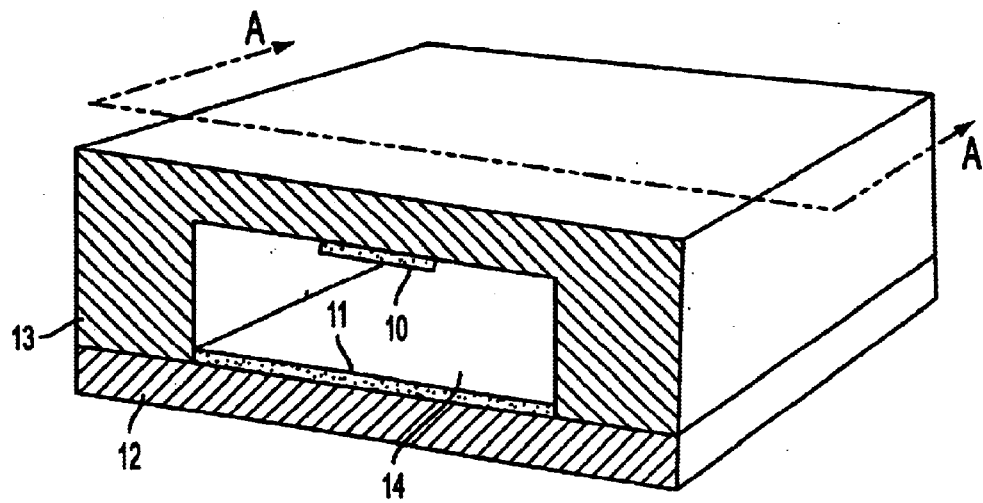
FIG. 1a shows in a perspective illustration a prior art inverted microstrip cable realised by multilayer technique.
Figure 1B:
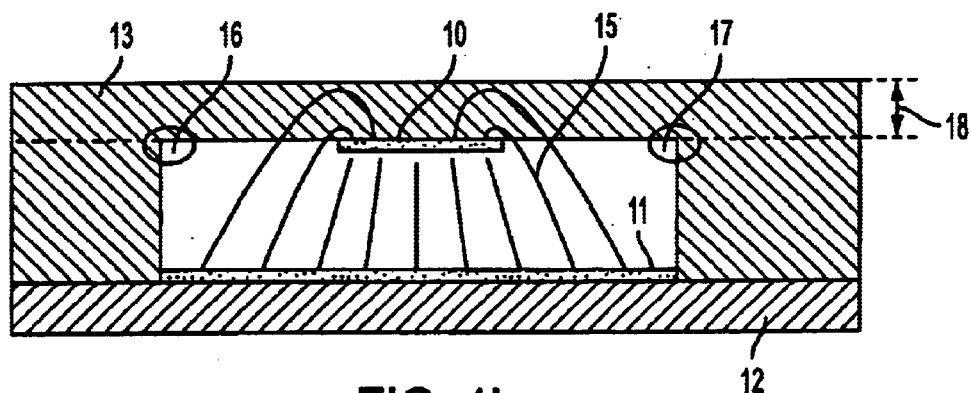
FIG. 1b shows a cross-section of the transmission cable of FIG. 1a, seen along the line A–A'.
Figure 2:
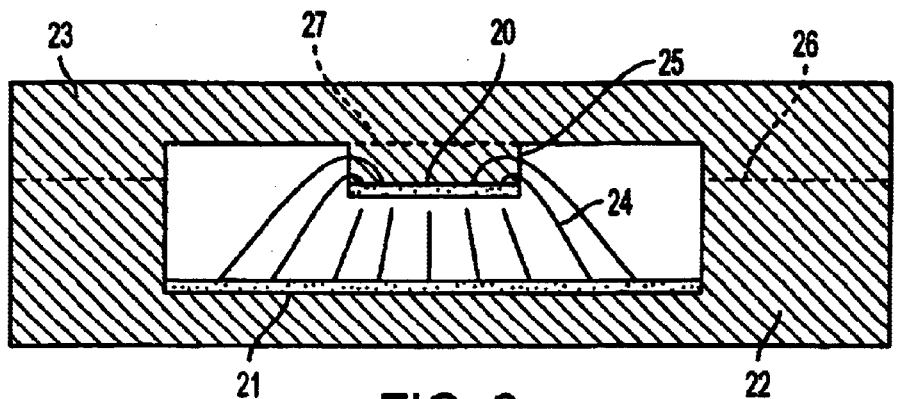
FIG. 2 shows in cross-section a preferred embodiment according to the invention.

FIGS. 1a and 1b were already dealt with in connection with the description of the prior art.

FIGS. 2–6 represent a few preferred embodiments according to the invention. All embodiments illustrated in the drawings consist of elements manufactured by multilayer technique, which elements can in the manufacturing process be combined to form a uniform structure. In the preferred embodiment of the invention illustrated in FIG. 2, the signal cable 20 of an inverted microstrip cable is attached to a support element 25 according to the invention. The walls surrounding the transmission cable can be made in a process explained above, in connection with the description of the prior art, for instance of two or more elements 22 and 23, which both are compiled of several green tapes. The sectional plane 26 of the elements, perpendicular to the patterns, is chosen so that the number of work steps in the manufacturing process is minimised. The support element 25 can likewise be made in several alternative ways. For example, it can be made so that the contact surface of the elements 22 and 23 is placed exactly on the level of the support element surface, which in the drawing is illustrated by a dotted line 26. On both sides of the support element 25, there are made grooves seen in the illustration.

Another alternative is to make a groove in the element 23 according to the method described in connection with FIG. 1a and to manufacture the support element 25 and the signal cable 20 separately with respect to the sectional plane, starting from the sectional plane illustrated by the dotted line 27. The support element 25 and the signal cable 20 are in later manufacturing steps attached, as a uniform structure, on the bottom of the groove made in the element 23. The ground cable 21 is made either in the way described in connection with FIG. 1a, or it may be silk-screened in a groove of a suitable size provided in the element 22, if the contact surface of the elements 22 and 23 is the plane illustrated by the dotted line 26. When the elements 22, 23 and the support element 25 are connected, the ground cable 21 is placed in the cable cavity in parallel with the signal cable 20. From the drawing it is seen that the electromagnetic field emitted from the signal cable 20 towards the ground cable 21, said field being illustrated by the power lines 24, clearly makes a shorter passage in the dielectric material, in the support element 25, than it has to make in the case of FIG. 1b, inside the element 13 made of a dielectric material. The major part of the transmission cable losses are composed exactly of the losses made in the dielectric material layer. As a consequence, the inverted microstrip cable according to the invention has a smaller attenuation per unit of length than the inverted microstrip cable according to the prior art. However, the impedance level of the transmission cable according to the invention can be adjusted to the desired magnitude, because the impedance of the transmission cable is affected by adjusting the outer dimensions of the support element 25 made of some dielectric material.

Figure 3:
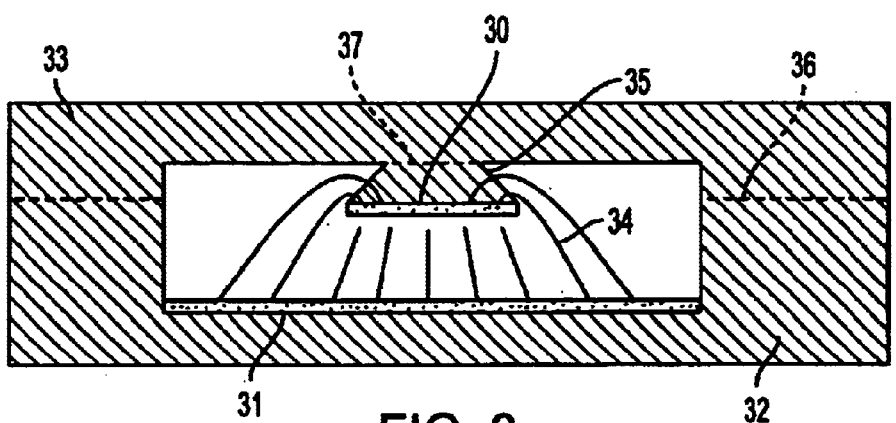
FIG. 3 shows in cross-section another preferred embodiment according to the invention.

In the embodiment illustrated in FIG. 3, the signal cable 30 of an inverted microstrip cable is attached to a support element 35, which is narrowed in a triangular fashion towards the bottom of the transmission cable cavity. The cable structure according to the drawing is composed of at least two separate elements 32 and 33. The contact surface of the elements, which in the drawing is illustrated by the dotted line 36, is chosen to be the best possible with respect to the manufacturing of the structure. The contact surface 36 of the elements 32 and 33 can be, as is illustrated, the plane of the signal cable 30 attached to the support element 35, but it can also be some other plane. The support element 35 can be produced in connection with the production of the element 33, but it can also be produced separately, in which case its contact surface with the element 33 can be a plane which in the drawing is illustrated by the dotted line 37. Part of the electromagnetic field, illustrated by the power lines 34, emitted from the signal cable 30 towards the ground cable 31, proceeds for a short length inside the support element 35. The part of the electromagnetic field that is left inside the support element is smaller than the part left in the bottom substrate in the prior art arrangement illustrated in FIG. 1b. In the illustrated preferred embodiment, the attenuation per unit of length is thus lower than the attenuation of an inverted microstrip cable according to the prior art.

Figure 4:
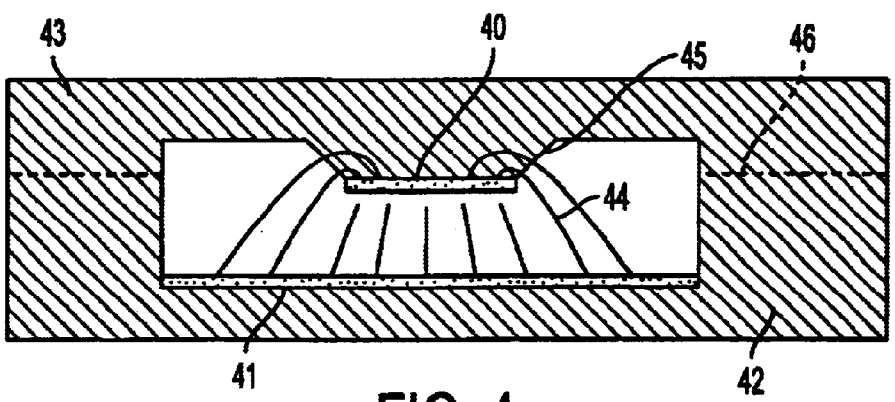
FIG. 4 shows in cross-section a third preferred embodiment according to the invention.

In the embodiment illustrated in FIG. 4, the signal cable 40 of an inverted microstrip cable is attached to a support element 45 that is wider towards the bottom of the groove made in the element 43. The illustrated structure is composed of at least two separate elements 42 and 43. The elements are treated so that inside the elements 42 and 43, there is created a cable cavity according to the illustration. The contact surface of the elements 42 and 43, illustrated by the dotted line 46, is chosen to be the best possible with respect to the manufacturing of the product. The contact surface of the elements 42 and 43 can be, as is illustrated, a plane of the signal cable 40 attached to the support element 45, but it may also be another plane that is advantageous for the manufacturing process. In this embodiment, part of the electromagnetic field, illustrated by the power lines 44, emitted from the signal cable 40 towards the ground cable 41, proceeds through the support element 45. However, the part that passes through the support element is remarkably smaller than in the case of the prior art inverted microstrip cable illustrated in FIG. 1b. Thus the attenuation per unit of length also in this embodiment is lower than in a prior art inverted microstrip cable.

Figure 5:
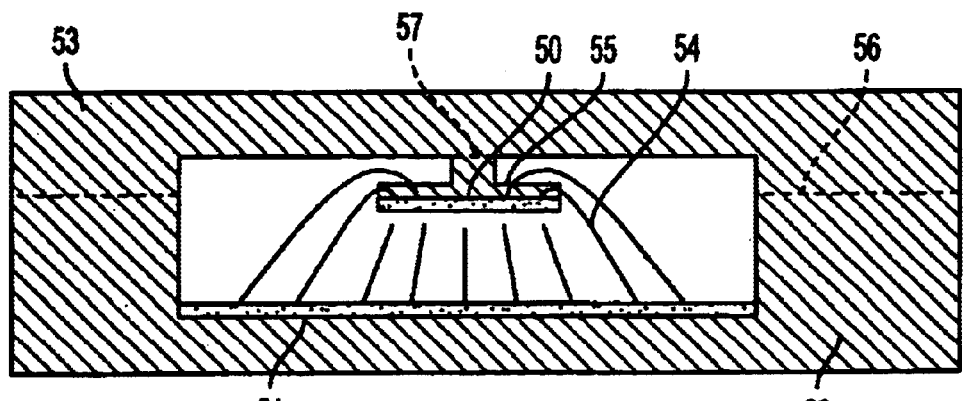
FIG. 5 shows in cross-section a fourth preferred embodiment according to the invention.

In the embodiment illustrated in FIG. 5, the signal cable 50 of an inverted microstrip cable is attached to a support element 55 having the shape of a T-beam. The walls encasing the transmission cable are composed of at least two elements 52 and 53, and the sectional plane perpendicular to the patterns of said elements, said sectional plane being illustrated by the dotted line 56, is chosen so that the number of work steps in the manufacturing process is minimized. The support element 55 can be manufactured in several alternative ways. One alternative is to produce the support element 55 and the signal cable 50 separately, starting from the plane at the base of the T-beam, which plane is illustrated by the dotted line 57. The support element 55 and the signal cable 50 are connected, as a uniform structure, to the element 52. The ground cable 51 can be produced for instance in the way illustrated in connection with FIG. 1b. When the elements 52, 53 and 55 are connected together, the ground cable 51 is located in the cable cavity on the opposite side of the signal cable 50. In FIG. 5 it is seen that the electromagnetic field emitted from the signal cable 50 towards the ground cable 51, which field in the drawing is illustrated by the power lines 54, passes only a short way in the dielectric material, in the support element 55. As a consequence, the inverted microstrip cable according to the drawing has an extremely low attenuation per length unit, in comparison with the attenuation of a prior art inverted microstrip cable.

SUMMARY OF THE INVENTION

Figure 6:
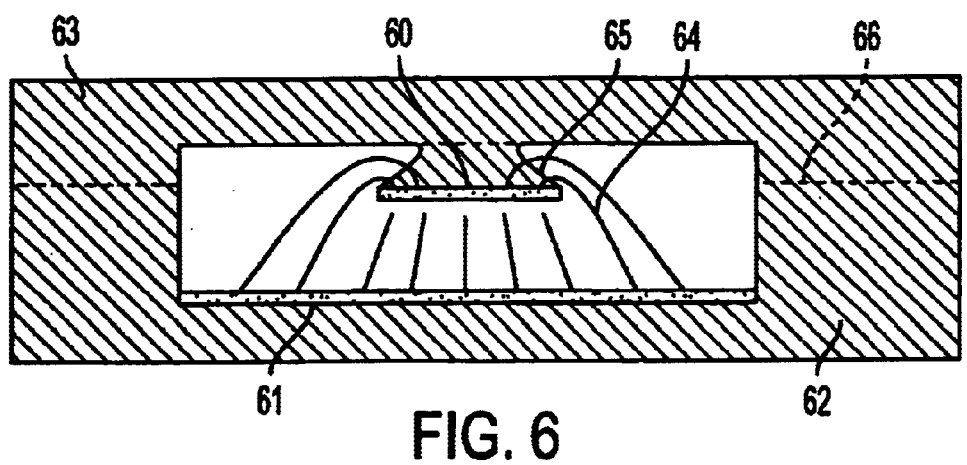
FIG. 6 shows in cross-section a fourth preferred embodiment according to the invention.

In the embodiment illustrated in FIG. 6, the transmission cable structure is composed of at least two elements 62 and 63. The contact surface of the elements 62 and 63, illustrated by the dotted line 66, is chosen to be the best possible with respect to the manufacturing of the product. It may be located at the illustrated point, in which case it is level with the surface of the support element 65, which in the drawing is illustrated by the dotted line 66. In this embodiment, the shape of the support element is inwardly curved. The support element 65 constitutes part of the element 63. Also in this embodiment only a small part of the electric field is emitted from the signal cable 60 towards the ground cable 61, which in FIG. 6 is illustrated by the power lines 64, proceeds in the dielectric material of the support element. Likewise, also in this embodiment the attenuation of an inverted microstrip cable according to the invention is low in comparison with a corresponding prior art transmission cable.

In the embodiments described above, the inverted microstrip cable according to the invention is placed in a cable cavity made of dielectric material layers. The number of the layers constituting the cable cavity wall may vary according to the employed technique and to an optimal number of working steps. The wall strength of the created cable cavity is assumed to be so good in all directions, that the other ground potential levels possibly located in the surroundings are placed far enough in order to prevent the shape of the electromagnetic field of the transmission cable from being disturbed thereby.

The invention is not restricted to the described embodiments only. For example, the structure of the walls forming the cable cavity can be divided into various levels by innumerable different ways. The employed manufacturing technique determines which method of dividing the wall parts to be created is optimal with respect to expenses and output. Likewise, the shape of the support element according to the invention can deviate from the preferred embodiments illustrated above. Also the manufacturing method of the employed signal and ground cables may be other than the suggested silk screen method. Other known cable structures, for example coplanar cable, can also be employed as the cable used in the structure. The inventive idea can be applied in various different ways within the scope of the patent claims.

What is claimed is:

1. A transmission cable constructed by multilayer technique, located in a cavity comprising a first dielectric surface and a second dielectric surface which is essentially parallel with the first surface, said transmission cable comprising:

a signal cable, which is essentially parallel to the first cavity surface, and a ground cable, which is placed on said second surface, essentially in parallel with the signal cable, and wherein said transmission cable also comprises a dielectric support element which has a dielectric surface that is essentially parallel with said first and second surfaces and is located between said first and second surfaces, so that said signal cable is provided with an electroconductive material layer disposed on the dielectric surface of the support element.

2. A transmission cable according to claim 1, wherein the support element is rectangular in shape.

3. A transmission cable according to claim 1, wherein the support element is a square.

4. A transmission cable according to claim 1, wherein the shape of the support element is a T-beam.

5. A transmission cable according to claim 1, wherein the shape of the support element is a surface defined by two curved surfaces.

6. A transmission cable according to claim 1, wherein the signal cable is an inverted microstrip cable.

7. The transmission cable of claim 1 wherein the first surface and the second surface share common side surfaces to define the cavity.

8. The transmission cable of claim 1 wherein the electroconductive material layer is disposed along an entirety of the surface of the support element.

9. The transmission cable of claim 1 wherein a plane of contact between the first surface and the second surface is along a plane of a surface of the support element.

10. The transmission cable of claim 1 wherein a groove is disposed along each side of the support element, each groove being disposed between a wall of the cavity and a side of the support element.

11. The transmission cable of claim 1 wherein the signal cable and the ground cable are separated by a medium that decreases attenuation.

12. The transmission cable of claim 11 wherein the medium is a gas or a vacuum.

13. A transmission cable comprising:
   a first dielectric surface substantially parallel to a second dielectric surface, which together with common, substantially perpendicular side walls, defines a cavity;
   a signal cable located near the first surface and essentially parallel to the first surface;
   a ground cable on the second surface and essentially parallel to the signal cable; and
   a support element having a dielectric surface substantially parallel to the first and second surfaces and located between the first and second surfaces, wherein the signal cable is provided with an electroconductive material layer disposed on an entirety of the surface of the support element, a groove is disposed along each side of the support element, each groove being disposed between a wall of the cavity and a side of the support element.

14. A transmission cable comprising:
   a first dielectric surface substantially parallel to a second dielectric surface, which together with common, substantially perpendicular side walls, defines a cavity;
   a signal cable located near the first surface and essentially parallel to the first surface;
   a ground cable on the second surface and essentially parallel to the signal cable; and
   a support element having a dielectric surface substantially parallel to the first and second surfaces and located between the first and second surfaces, wherein the signal cable is provided with an electroconductive material layer disposed on an entirety of the surface of the support element.

15. The transmission cable of claim 14 wherein the cavity provides a medium to decrease attenuation.

16. The transmission cable of claim 15 wherein the medium is gas or a vacuum.

* * * * *